United States Patent [19]

Rambow

[11] Patent Number: 4,691,307
[45] Date of Patent: Sep. 1, 1987

[54] AGC CIRCUIT FOR TELEVIEWER

[75] Inventor: Frederick H. K. Rambow, Houston, Tex.

[73] Assignee: Shell Oil Company, Houston, Tex.

[21] Appl. No.: 778,770

[22] Filed: Sep. 23, 1985

Related U.S. Application Data

[63] Continuation of Ser. No. 459,443, Jan. 20, 1983, abandoned.

[51] Int. Cl.$^4$ .............................................. G01V 1/40
[52] U.S. Cl. ...................................... 367/69; 330/281; 330/284; 367/65
[58] Field of Search ...................... 367/69, 65, 66, 98, 367/71, 190, 911; 330/281, 284; 181/104, 105; 73/623, 631

[56] References Cited

U.S. PATENT DOCUMENTS

| | | | |
|---|---|---|---|
| 3,406,780 | 10/1968 | Zemanek, Jr. | 181/104 |
| 3,478,839 | 11/1969 | Zemanek, Jr. | 181/104 |
| 3,553,640 | 1/1971 | Zemanek, Jr. | 181/104 |
| 3,775,749 | 11/1973 | Tegholm | 367/65 |
| 3,790,896 | 2/1974 | Shimizu et al. | 330/281 |
| 3,904,975 | 9/1975 | Satoh | 330/284 |
| 4,134,079 | 1/1979 | Kohtani | 330/284 |

OTHER PUBLICATIONS

Heard et al., "Development of a Geothermal Acoustic Borehole Televiewer," Sandia National Lab., DOE Contract DE-AC04-76DP00789, 8/83.
Georgi, D. T., "Geometrical Aspects of Borehole Televiewer Images," SPWLA 26th Annual Logging Symposium, 6/17/85, 19 pages.
Rambow, F. H. K., "The Borehole Televiewer: Some Field Examples," Shell Development Corp., 21 pages, SPWLA 25th Annual Logging Symposium, 6/10/84, Louisiana.

Primary Examiner—Thomas H. Tarcza
Assistant Examiner—Ian J. Lobo

[57] ABSTRACT

A borehole televiewer circuit for compensating for out-of-roundness of a borehole. The circuit comprises an automatic gain control circuit having time constants that allow detection of borehole anomalies while having a fast enough rise time to adjust for the effects of out-of-roundness.

18 Claims, 4 Drawing Figures

AGC CIRCUIT FOR TELEVIEWER

This is a continuation of application Ser. No. 459,443, filed Jan. 20, 1983 now abandoned.

BACKGROUND OF THE INVENTION

The present invention relates to borehole logging tools and particularly to a tool that is described as a borehole televiewer (BHTV). A borehole televiewer utilizes a rotating acoustic transducer that is periodically pulsed to produce acoustic energy which travels outwardly and strikes the borehole wall and is reflected back to the transducer. The amplitude of the reflected signal is displayed on a cathode ray tube whose face may be photographed. The resulting photograph represents a map of the borehole wall split along the north direction and laid out flat. The transducer is pulsed at a relatively high rate, for example, 1500 pulses per second, while the transducer rotation period is 0.333 seconds. The sweep of the oscilloscope is controlled by a north synchronization signal which is produced by a flux gate magnetometer which rotates in unison with the transducer.

While the above tools are useful in obtaining a display of the borehole wall that indicates the locations of fractures or other features, it does have a a serious limitation when used in a non-circular or elliptical borehole. The same problem also arises when the tool moves off center as a result of its travel through the borehole. It can be shown that when the BHTV is located off center or in a non-circular hole, the acoustic energy will be scattered at all locations except where the acoustic energy strikes the borehole wall normal to a tangent at this point. Thus, the reflected energy received by the transducer will have four positions where it is at a maximum and in the remaining positions the reflected energy will be decreased. The BHTV as presently available has various amplifier gain levels that are selected by a rotary switch controlled from the surface. Since the amplitude is set from the surface, it cannot be varied to provide the proper amplification as the transducer rotates. Thus, the resulting display will have light and dark areas where details are lacking. It should be appreciated that in normal operations a fracture or other anomaly in the borehole wall will not reflect energy and will appear as a dark shadow on the display.

SUMMARY OF THE INVENTION

The present invention solves the problems of utilizing a BHTV in a non-circular borehole by providing an AGC circuit for the amplifier. The circuit has a relatively slow rise time and a very fast decay or fall time. The circuit utilized is not a true automatic gain control circuit in the sense that the gain of the amplifier is changed but rather a voltage dividing circuit that shorts part of the incoming signal to ground and thus decreases the input signal to the amplifier. This allows the amplifier to retain the gain setting selected from the surface while increasing the signal level to provide details when the reflected signal is weak.

The decay constant for the AGC circuit is less than the cycle time of the transducer so that the amplifier will not saturate when the reflected signal suddenly increases in amplitude. The rise time of the AGC circuit extends over several cycles so that the amplifier will not obscure fractures or other anomalies in the borehole wall that have a short circumferential extend along the wall.

The actual AGC circuit comprises a field effect transistor whose gate voltage is controlled to control its conduction to ground. Thus, the field effect transistor acts as a voltage divider circuit in the input circuit of the amplifier.

BRIEF DESCRIPTION OF THE DRAWINGS

The invention will be more easily understood from the following description when taken in conjunction with the attached drawings in which.

DESCRIPTION OF THE PREFERRED EMBODIMENT

Figure 1:
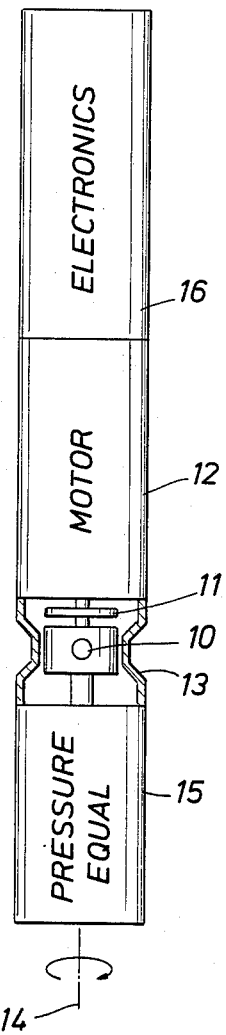
FIG. 1 is a schematic elevation view of a borehole televiewer.

Referring now to FIG. 1, there is shown the BHTV that includes an acoustic transducer 10 and a flux gate magnetometer 11 which are mounted on a common shaft. The shaft is rotated by motor 12 about the axis 14 of the BHTV. Electronics for control of the pulsing of the transducer and the transmission of the reflected signals to the surface is contained in a section 16 of the tool while a pressure equalization chamber 15 is mounted in the bottom portion of the tool. The pressure equalization chamber serves to equalize the pressure on the interior of the acoustic window 13 with the pressure of the fluid in the borehole. By equalizing the pressure the required mechanical strength of the acoustic window can be reduced and allow the use of materials which provide a good acoustic match between the fluid filling the BHTV and the borehole fluid.

Figure 2:
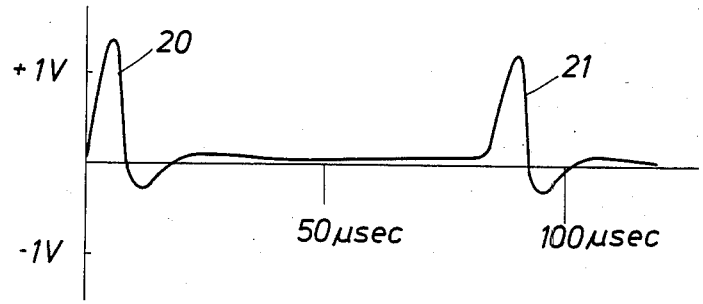
FIG. 2 is a waveform of the signals produced by the borehole televiewer.

Referring to FIG. 2, there is shown the waveforms of the signals produced by the BHTV. In particular, the signal 20 represents the acoustic pulse produced by the transducer while the signal 21 represents the reflected signal received by the transducer. As shown, a time interval of approximately 100 microseconds elapses between the production of the acoustic pulse and the receipt of the reflected signal. The time lapse, of course, depends upon the diameter of the borehole but 100 microseconds is representative. The actual BHTV tool that is available commercially has a repetition or cycle rate of the acoustic transducer that is approximately 1500 cycles per second while the rotational cycle of the transducer is 0.333 seconds. Thus, the BHTV provides approximately 500 acoustic pulses per rotation of the transducer for scanning the borehole wall.

Figure 3:
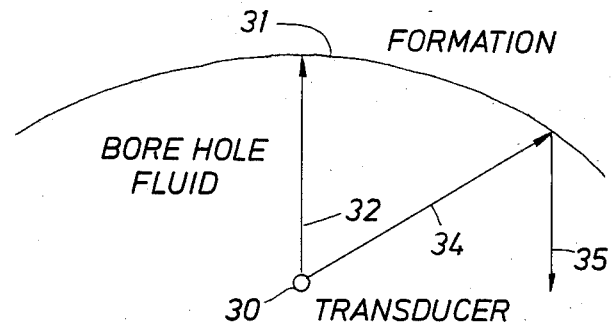
FIG. 3 is a graphic representation of the borehole televiewer located in a non-circular borehole.

Referring to FIG. 3, there is shown a schematic arrangement of the BHTV in a borehole wall that illustrates the problem produced by a non-circular borehole or a BHTV positioned off center. As shown, the transducer 30 is located at approximately the geometric center of the non-circular borehole 31. When the acoustic pulse travels along the path 32, it is appreciated that it strikes the borehole normal to a tangent at the point at which it strikes and is reflected back to the transducer 30. In contrast, when the acoustic energy travels along the path 34, it strikes the borehole wall at an angle to a tangent at the point at which it strikes and instead of being reflected back, the major portion of the energy is scattered or reflected along the path 35. From the above description, it can be readily appreciated that the energy received by the transducer along the path 32 will greatly exceed the acoustic energy received along the path 34. Thus, if details of the borehole are to be displayed some means must be taken for increasing the gain of the transducer amplifier as it rotates from the position 32 to the position 34. While the gain must be adjusted, it must be adjusted slowly since the change in the path of acoustic energy occurs at a slow rate. While the gain must be adjusted slowly there are positions where the energy may be reflected directly back to the acoustic transducer due to a fracture or other anomaly in the borehole wall. At these positions, the gain of the amplifier must be decreased very rapidly so that the anomaly is not obscured in the final display of BHTV data.

Figure 4:
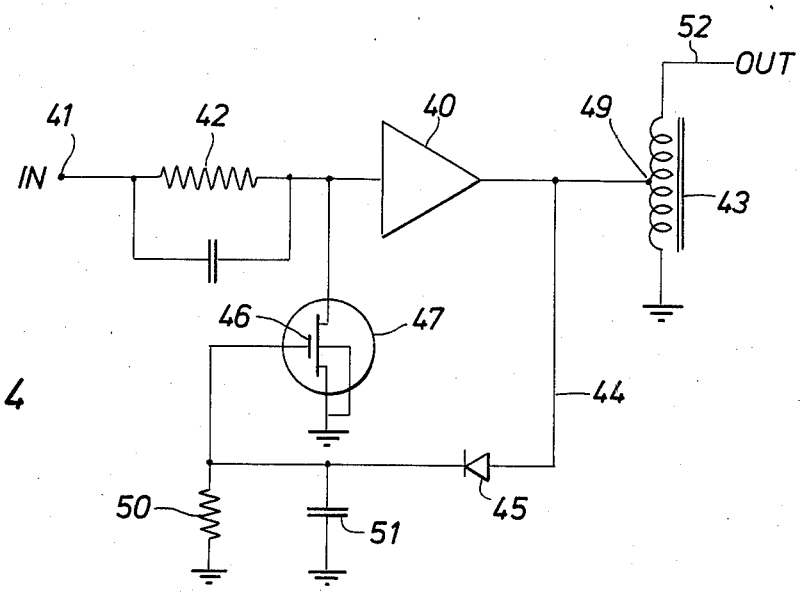
FIG. 4 is a schematic drawing of the automatic gain control circuit of the invention.

Referring to FIG. 4, there is shown a simple automatic gain control circuit for controlling the transducer amplifier. The circuit utilizes a field effect transistor 47 which is operated as a voltage divider to shunt a portion of the input signal 41 of the amplifier 40 directly to ground. The gain control circuit does not adjust the gain of an amplifier as is traditional with AGC circuits but rather is a voltage dividing circuit formed by the resistor 42 and the resistance of the field effect transistor 47. The resistance of the field effect transistor is proportional to the voltage applied to the gate 46. The input signal 41 is both resistively and capacitively coupled to the amplifier 40 through an RC circuit which includes resistor 42. The output of the signal of the amplifier is coupled to an impendance 43 which is used to match the output of the amplifier to the logging cable. The automatic gain control is provided by the feedback circuit 44 which signal is rectified by the diode 45. The rectified signal is applied to the gate 46 of the field effect transistor 47 to control the conduction thereof. By controlling the conduction of the field effect transistor the input voltage 41 applied to the amplifier 40 can be controlled. The feedback signal charges an RC circuit comprising the resistance 50 and the capacitance 51 whose values are chosen to provide an amplifier gain rise time of approximately 20 milliseconds and a decay time of 600 microseconds. Thus, the decay time is slightly shorter than the time between the successive cycles of the acoustic transducer 10. As can be appreciated if the output voltage of the amplifier 40 increases to a high value, the capacitor 51 would be immediately charged and the voltage on the gate 46 will be an extremely high voltage thus reducing the resistance of the field effect transistor 47 and the corresponding signal voltage applied to the input of the amplifier 40. The charging rate of the capacitor 51 is controlled by the internal resistance of the diode 45 which is relatively low and thus the 600 microsecond decay time of the AGC circuit can be readily achieved. As the voltage on the output of the amplifier 40 decreases the capacitor 51 will discharge to ground through the resistance 50 thus reducing the voltage on the gate 46. This discharge rate is largely controlled by the product of resistance 50 and capacitor 51 and is chosen to be on the order of 20 milliseconds. This will increase the resistance of the field effect transistor 47 and raise the voltage level of the input to the amplifier 40. When the voltage on the capacitor is completely discharged the field effect transistor 47 will act as a very high resistance and apply the maximum voltage signal to the input of the amplifier 40.

From the above description, it is seen that the invention provides a simple gain control for the transducer amplifier which has a slow rise time therefore increasing the output voltage of the amplifier at a slow rate but has a very fast cutoff so that the amplifier will not saturate. The AGC circuit will allow the BHTV to obtain an accurate representation of the wall of the borehole and the presence of fractures and other anomalies in the borehole wall will not be lost because of the saturation of the amplifier. Likewise, the signal increases as the transducer approaches a position where the path of acoustic energy will be normal to the borehole wall, so the gain of the amplifier will be reduced. Thus, signals providing an accurate representation of the borehole wall will be obtained. It is to be understood that when the term "gain of the amplifier" is used, it is to describe the voltage dividing circuit formed by the resistance 42 and the field effect transistor 47 that effectively control the voltage level of the input signal supplied to the amplifier 40. As explained, this is not a true automatic gain control circuit but functions in the same manner as an automatic gain control circuit.

What is claimed is:

1. A system for acoustically mapping the wall of a borehole, comprising:
   (a) a borehole televiewer including an acoustical transducer moveable within the borehole for transmitting successive acoustic signals toward successive portions of the borehole wall,
   (b) circuit means in said borehole televiewer coupled to said transducer to cause said transducer to produce a sequence of acoustic pulses,
   (c) amplifier means coupled to said transducer to produce a signal whose amplitude is related to the amplitude of the acoustic signal that is reflected from the borehole wall and received by said transducer, and
   (d) amplitude gain control means coupled to said amplifier means to automatically control the amplitude of the output signal of said amplifier means at least in part as a known function of said received acoustic signal amplitudes, said function including rise and decay characteristics selected for compensating for geometrically induced cyclical variations in the received acoustic signal amplitude to avoid obscuring borehole wall anomalies while simultaneously protecting said amplifier from saturating, and thereby providing accurate representations of substantially the entire wall of the borehole portion being mapped.

2. The system of claim 1 wherein said amplitude gain control means has a slow rise time and a rapid decay time.

3. The system of claim 1 wherein:
   (a) said acoustical transducer is disposed for rotation in the borehole for circularly scanning the borehole wall, and
   (b) said predetermined combination effectively includes substantially fewer than those pulses occurring in one transducer rotation.

4. The system of claim 3 wherein the rise time of said amplitude gain control means extends over less than one-quarter of the time required for said transducer to make one complete revolution in said borehole.

5. The system of claim 1 wherein said amplitude gain control means predetermined function is a predetermined combination of a plurality of said received acoustic signal amplitudes.

6. The system of claim 1 wherein the decay time of said amplitude gain control means is less than the time elapsing between successive acoustic pulses.

7. The system of claim 1 wherein said amplitude gain control means includes a gate means for connecting the input of the amplifier to ground, said gate means includes a variable resistance, and said variable resistance is controlled by the amplitude of the output signal of said amplifying means.

8. The system of claim 7 wherein said gate means further comprises a field effect transistor, means for converting the output signal of said amplifier to a voltage signal, and means for controlling the conduction of said field effect transistor with said voltage signal.

9. A system for acoustically mapping the wall of a borehole, comprising:
   (a) a borehole televiewer including an acoustical transducer moveable within the borehole and disposed for rotation in the borehole for circularly scanning the borehole wall for transmitting successive acoustic signals toward successive portions of the borehole wall,
   (b) circuit means in said borehole televiewer coupled to said transducer to cause said transducer to produce a sequence of acoustic pulses,
   (c) amplifier means coupled to said transducer to produce a signal whose amplitude is related to the amplitude of the acoustic signal that is reflected from the borehole wall and received by said transducer,
   (d) amplitude gain control means coupled to said amplifier means to automatically control the amplitude of the output signal of said amplifier means at least in part as a known function of a plurality of said received acoustic signal amplitudes, said plurality effectively including subtantially fewer than those pulses occurring in one transducer rotation, said function including slow rise time and fast decay time characteristics selected for compensating for geometrically induced cyclical variations in the received acoustic signal amplitude to avoid obscuring borehole wall anomalies while simultaneously protecting said amplifier from saturating, the rise time of said amplitude gain control means extending over less than one-quarter of the time required for said transducer to make one complete revolution in said borehole, and the decay time of said amplitude gain control means being less than the time elapsing between successive acoustic pulses, thereby providing accurate representations of substantially the entire wall of the borehole portion being mapped, and
   (e) said amplitude gain control means including a field effect transistor gate means used as a variable resistance for connecting the input of the amplifier to ground, and means for converting the amplitude of the output signal of said amplifier to a voltage signal to control the conduction of said field effect transistor.

10. A borehole televiewer method for acoustically mapping the wall of a borehole, comprising:
    (a) transmitting successive acoustic signals toward successive portions of the borehole wall,
    (b) receiving the acoustic signals which are reflected back from the borehole wall,
    (c) producing an output signal whose amplitude is related to the amplitude of the reflected acoustic signal that is received, and
    (d) automatically controlling the amplitude of the output signal at least in part as a known function of the received acoustic signal amplitudes, the function including rise and decay characteristics selected for compensating for geometrically induced cyclical variations in the received acoustic signal amplitude to avoid obscuring borehole wall anomalies while simultaneously protecting the output signal from saturating, and thereby providing accurate representations of substantially the entire wall of the borehole portion being mapped.

11. The method of claim 10 wherein the rise and decay characteristics include a slow rise time and a rapid decay time.

12. The method of claim 10 wherein:
    (a) the acoustical signals circularly scan the borehole wall, and
    (b) the predetermined combination effectively includes substantially fewer than those signals occurring in one such circular scan.

13. The method of claim 12 wherein the rise time extends over less than one-fourth of the time required for one circular scan of the borehole.

14. The method of claim 10 wherein the predetermined function is a predetermined combination of a plurality of the received acoustic signal amplitudes.

15. The method of claim 10 wherein the decay time is less than the time elapsing between successive acoustic signals.

16. The method of claim 10 further comprising connecting the input of the amplifier to ground through a gate means having a variable resistance, and controlling the variable resistance as a function of the amplitude of the output signal.

17. The method of claim 16 wherein the gate means is a field effect transistor, and further comprising converting the output signal to a voltage signal and controlling the conduction of the field effect transistor by means of the voltage signal.

18. A borehole televiewer method for acoustically mapping the wall of a borehole, comprising:
    (a) transmitting successive acoustic signals in a circular scan toward successive portions of the borehole wall,
    (b) receiving the acoustic signals which are reflected back from the borehole wall,
    (c) producing an output signal whose amplitude is related to the amplitude of the reflected acoustic signal that is received,
    (d) automatically controlling the amplitude of the output signal at least in part as a known function of a plurality of the received acoustic signal amplitudes, the plurality effectively including substantially fewer than those signals occurring in one such circular scan, the function including slow rise time and fast decay time characteristics selected for compensating for geometrically induced cyclical variations in the received acoustic signal amplitude to avoid obscuring borehole wall anomalies while simultaneously protecting the output signal from saturating, the rise time extending over less than one-quarter of the time required for one circular scan of the borehole, and the decay time being less than the time elapsing between successive acoustic signals, thereby providing accurate representations of substantially the entire wall of the borehole portion being mapped, and
    (e) connecting the input of the amplifier to ground through a field effect transistor gate means used as a variable resistance, and converting the output signal to a voltage signal for controlling the conduction of the field effect transistor by means of the voltage signal.

* * * * *